United States Patent [19]
Gall et al.

[11] Patent Number: 5,659,951
[45] Date of Patent: Aug. 26, 1997

[54] METHOD FOR MAKING PRINTED CIRCUIT BOARD WITH FLUSH SURFACE LANDS

[75] Inventors: Thomas Patrick Gall, Lancaster; David Brian Stone, Owego; Russell Thomas White, Jr., Conklin; James Robert Wilcox, Vestal, all of N.Y.

[73] Assignee: International Business Machines Corporation, Armonk, N.Y.

[21] Appl. No.: 632,232

[22] Filed: Apr. 15, 1996

[51] Int. Cl.⁶ .................................................. H05K 3/36
[52] U.S. Cl. ........................... 29/830; 29/829; 29/852; 427/97
[58] Field of Search ........................... 29/852, 829, 830; 427/97, 98

[56] References Cited

U.S. PATENT DOCUMENTS

| | | | |
|---|---|---|---|
| 4,293,592 | 10/1981 | Morishita et al. | 427/97 X |
| 4,487,654 | 12/1984 | Coppin | 29/852 X |
| 4,512,829 | 4/1985 | Ohta et al. | 427/97 X |
| 4,770,900 | 9/1988 | Seibel . | |
| 4,915,983 | 4/1990 | Lake et al. . | |
| 5,093,186 | 3/1992 | Kimura et al. . | |
| 5,102,720 | 4/1992 | Raj . | |
| 5,149,615 | 9/1992 | Chakravorty et al. . | |
| 5,153,987 | 10/1992 | Takahashi et al. | 29/852 |
| 5,316,894 | 5/1994 | Takahashi et al. . | |
| 5,347,712 | 9/1994 | Yasuda et al. | 29/852 |
| 5,359,767 | 11/1994 | Chen et al. | 427/97 X |

FOREIGN PATENT DOCUMENTS

| | | | |
|---|---|---|---|
| 1-99288 | 4/1989 | Japan | 29/852 |
| 2-84794 | 3/1990 | Japan | 29/829 |
| 5-152754 | 6/1993 | Japan | 29/829 |
| 5-191054 | 7/1993 | Japan | 29/852 |

*Primary Examiner*—Carl J. Arbes
*Attorney, Agent, or Firm*—Arthur J. Samodovitz

[57] ABSTRACT

A method for making a printed circuit board with a flush surface land begins by forming a multi-layer printed circuit board with a recess in a surface dielectric layer. Then, a hole is drilled into or through the printed circuit board; the hole communicates with the recess. After the recess is formed, a conductive material is provided in the recess to form a surface land and provided on an inner surface of the hole to form a plated hole which is electrically connected to the surface land. The conductive material in the recess has a thickness substantially equal to a depth of the recess such that the surface land is flush with an adjacent surface of the dielectric surface layer.

17 Claims, 5 Drawing Sheets

METHOD FOR MAKING PRINTED CIRCUIT BOARD WITH FLUSH SURFACE LANDS

BACKGROUND OF THE INVENTION

The invention relates generally to printed circuit boards and deals more particularly with a method for making a printed circuit board with surface lands which are flush with the adjacent surface region.

Printed circuit boards are widely used today to mount and interconnect electrical components to form electrical circuits. Often, printed circuit boards contain several layers, and electrical components of a circuit are mounted on an exposed surface of an outer dielectric sheet. The exposed surface also contains printed signal conductors to provide some interconnections between the electrical components. Some of the inner layers comprise dielectric sheets with printed signal conductors. Other inner layers comprise sheets of copper sandwiched between barren surfaces of dielectric sheets, and are used for power and ground planes. Additional connections between the signal conductors and power and ground planes are made with copper plated through holes (PTHs) or "vias" which interconnect conductors of different layers. PTHs can pass entirely through all layers of the printed circuit board or pass only through some of the layers as required. Examples of various types of multilayers printed circuit board constructions are provided by U.S. Pat. Nos. 4,030,190, 4,554,405, 4,854,038, 4,868, 350, 5,191,174, 4,803,450 and 5,046,238 and German patent DE3316017.

For applications where the PTHs require electrical surface connection to components mounted on or to the surface layer or to another printed circuit board, surface lands are provided. Surface lands are metallic pads which are printed on the surface of the printed circuit board adjoining the associated PTH usually above and around the PTH. The surface lands abut against metallic pads or feet of the other component or other printed circuit board. For example, a high power product may comprise a main printed circuit board as described above and a power distribution printed circuit board. The main printed circuit board comprises components and printed conductors on one exposed surface and inner layers to provide other interconnections. The power distribution printed circuit board includes thick conductive planes and associated vias and surface lands for power and ground to carry the high current involved. The power distribution printed circuit board is joined to the other exposed surface of the main printed circuit board to evenly distribute power to the main printed circuit board.

PTHs typically begin with a hole drilled through the requisite layers. Then, the hole is electrolessly plated or "seeded" with copper and then additional copper is electrically plated onto the copper seed. For some applications, a precious metal may also be plated over the copper. If a surface land is required, the PTH extends to the surface of the printed circuit board, and surface lands are provided by metallic printing on the surface of a dielectric sheet right adjoining the periphery of the PTH. With this technique, the surface lands are raised slightly above the adjacent surface region of the dielectric sheet, i.e. by the thickness of the surface land. If the surface land is thin, for example less than 0.7 mils, the surface land can be pressed flush with the dielectric sheet that supports the surface land. This is described in U.S. Pat. Nos. 5,359,767 and 5,442,144 (which patents are hereby incorporated by reference as part of the present disclosure) and results in an axial compression of the respective PTH and an out-of-plane deformation of layer regions connected to the PTH. However, for high power applications such as the power distribution printed circuit board, the surface lands may be too thick (for example, greater than 0.7 mils) to easily press flush with the associated dielectric sheet. There are many other applications that require flush surface lands which are thin or thick.

A general object of the present invention is to provide a method for making a printed circuit board with flush surface lands which method does not require high pressure applied to the surface lands.

A more specific object of the present invention is to provide a method of the foregoing type which is applicable for thick surface lands.

SUMMARY OF THE INVENTION

The invention resides in a method for making a printed circuit board with a flush surface land. The method begins by forming a multi-layer printed circuit board with a recess in a surface dielectric layer. Then, a hole is drilled into or through the printed circuit board; the hole communicates with the recess. After the recess is formed, a conductive material is provided in the recess to form a surface land and provided on an inner surface of the hole to form a plated hole which is electrically connected to the surface land. The conductive material in the recess has a thickness substantially equal to a depth of the recess such that the surface land is flush with an adjacent surface of the dielectric surface layer. The invention also resides in the resultant printed circuit board.

DETAILED DESCRIPTION OF THE PREFERRED EMBODIMENTS

Figure 1:
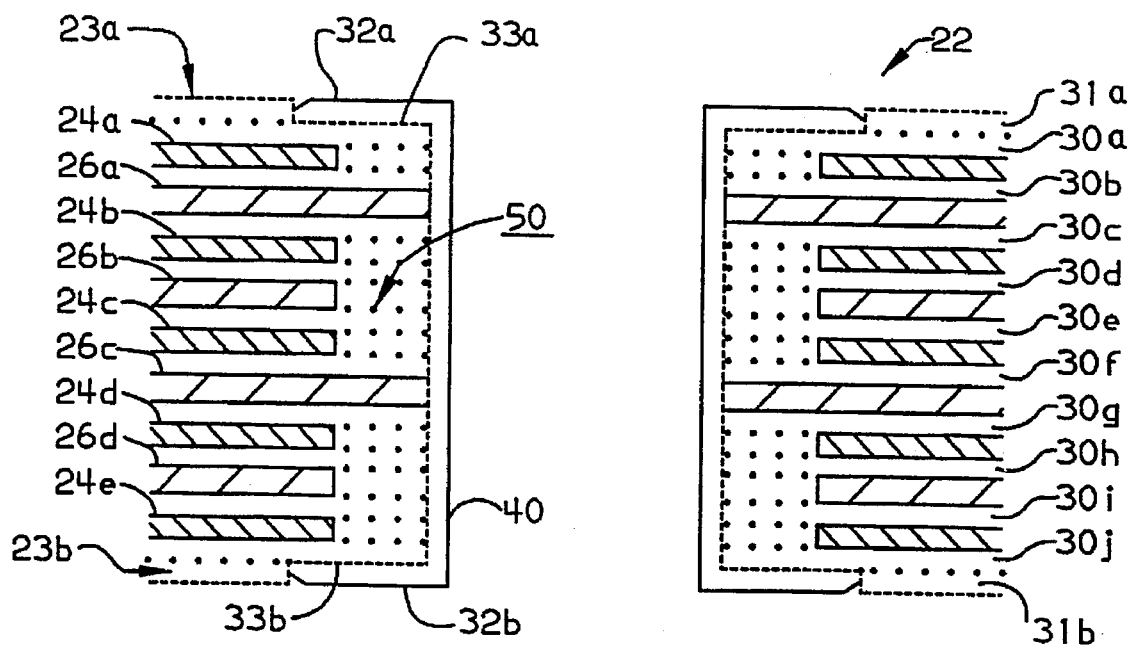
FIG. 1(a) is a cross-sectional view of a section of a printed circuit board made according to the present invention.
FIG. 1(b) is a top view of the section of FIG. 1(a).

Referring now to the drawings in detail, wherein like reference numbers indicate like elements throughout, FIGS. 1(a,b) illustrate a printed circuit board generally designated 22 which was made according to the present invention. Printed circuit board 22 comprises surface layers 23a,b, Invar metal layers 24a–e (which control thermal expansion of printed circuit board 22), thicker conductive planes 26a–d (printed or sheets) for power and ground and dielectric layers 30a–j interlaced with all the other layers to insulate the surface and conductive layers from each other. (If desired, layers 24a–e can instead comprise signal conductors for another application or signal conductors can be provided in addition to the Invar layers 24a–e.) Typically, the conductive planes 26a–d are made of copper. By way of example, the conductive planes are 1.4 mils thick, and the dielectric layers comprise reinforced epoxy resin (a/k/a FR4), polyimide or polytetrafluoroethylene (PTFE). In the illustrated embodiment, the surface layers 23a,b do not contain any components mounted thereon (although there may be applications utilizing the present invention where the surface layer comprises discrete components mounted away from the surface lands). Instead, each of the surface layers 23a,b comprises a respective dielectric sheet 31a,b and a multiplicity of copper surface lands such as copper surface lands 32a,b. Each of the surface lands 32a,b is printed or deposited into a respective recess 33a,b in the dielectric sheets 31a,b. By way of example, the recesses are 1.0 mils deep and the surface lands are 1.0 mils thick although the present invention can be utilized for surface lands of virtually any thickness, for example 0.7–2.8 mils. (The method described in U.S. Pat. Nos. 5,442,144 and 5,359,767 may be less expensive for surface land thicknesses less than 0.7 mils, although if desired, the method of the present invention can be used for thicknesses less than 0.7 mils also.) The depth of each recess equals the thickness of the surface land material and consequently, the surface lands are flush with the adjacent surface region of the respective dielectric sheet 31a,b. A copper plated through hole (PTH) 40 (or "barrel") passes entirely through the printed circuit board 22 and makes electrical connection with conductive power planes 26a,c and surface lands 32a,b. By way of example, the PTH plating is nearly 1.0 mils thick. The metallic Invar layers 24a–e and conductive planes b,d are spaced (clearance region 50) from PTH 40 to avoid electrical connection therewith and the space is filled with dielectric material. Other PTHs not shown, but identical to PTH 40, and other associated surface lands not shown, but identical to surface lands 32a,b, are also provided in printed circuit board 22 at other locations to distribute power from power planes 26a,c and also distribute ground planes 26b,c as needed.

FIGS. 2–6 illustrate a method according to the present invention for making printed circuit board 22 with the flush surface lands 32a,b. Inner layers 24a–e, 26a–d and 30a–j are independently formed in a known manner. For example, Invar layers 24a–e comprise Invar foil and the conductive plane layers 26a–d comprise copper foil. Layers 24a–e and 26b,d are etched, drilled or punched to provide the requisite clearance region 50. Other clearance regions, not shown, are etched, drilled or punched to contain other PTHs, not shown. Dielectric layers 30a–j may comprise sheets of thermoset materials such as reinforced epoxies and polyimides or sheets of thermoplastic materials such as fluoropolymer based dielectrics. Surface layers 31'a,b without the recesses 33a,b or surface lands 32a,b are flat and comprise a dielectric material (as described above).

Figure 2:
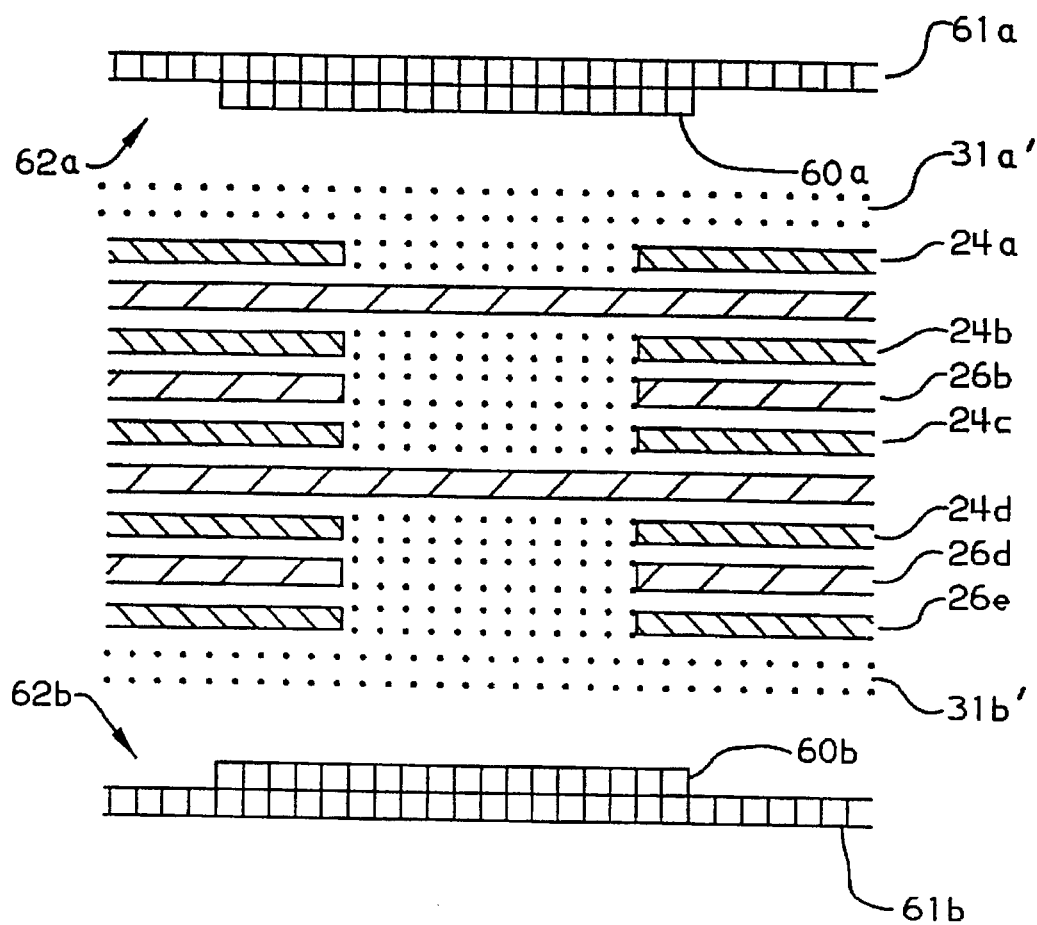
FIG. 2 is a cross-sectional view of a laminate and pattern foil used to form the printed circuit board of FIG. 1.
Figure 1:
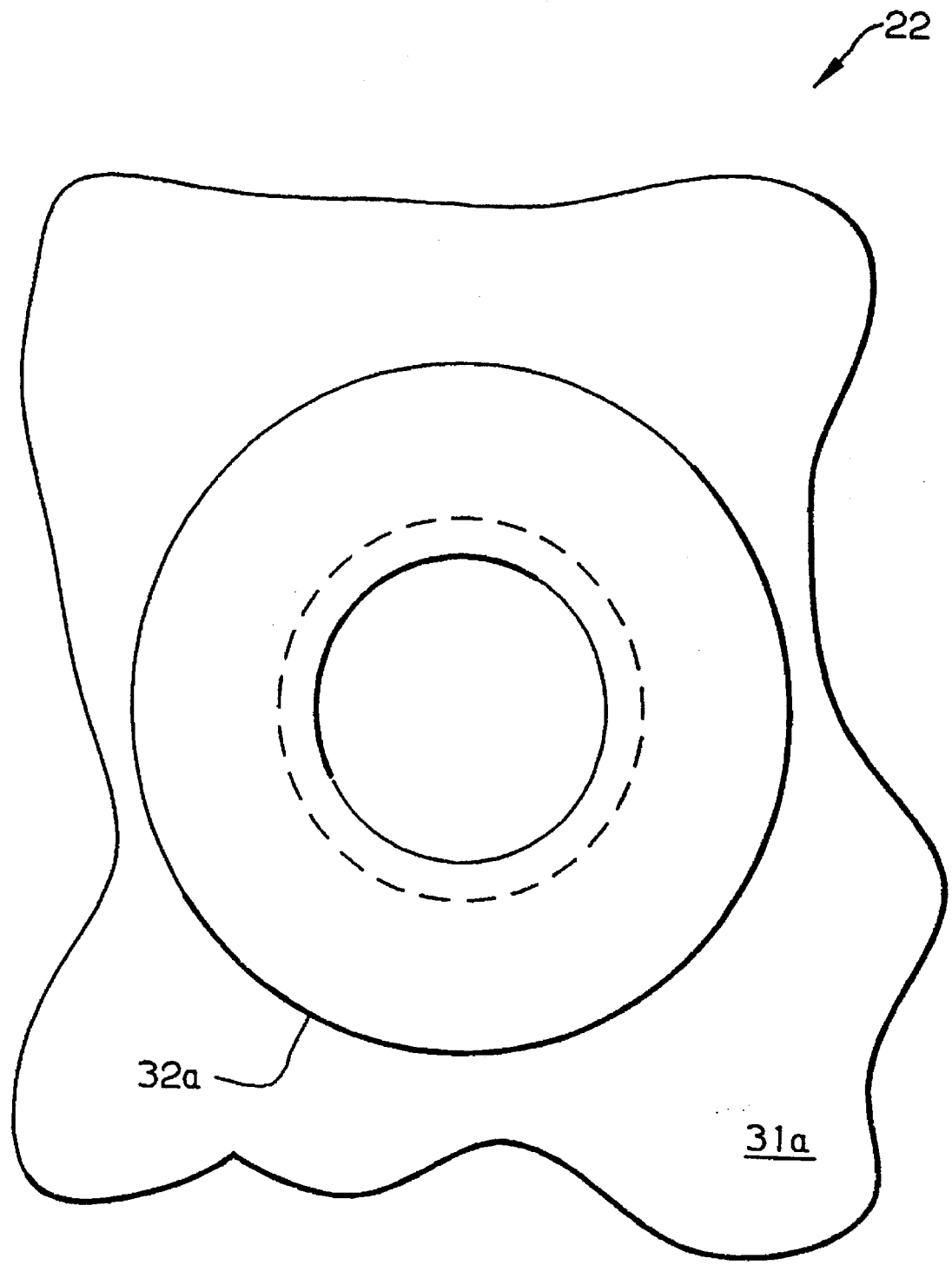

The recesses and surface lands are formed as follows. A protruding pattern 60a of copper is plated or printed onto a sheet 61a of copper foil or etched into a sheet of copper foil to yield the pattern foil 62a. The thickness of the raised pattern 60a equals the thickness of the desired surface land, for example 1.0 mils and the copper foil 61a is chosen for convenience of handling and/or subsequent etching. A mirror image copper foil 61b with raised pattern 60b is also formed in the same manner. At this time, surface layers 31'a,b are flat as illustrated in FIG. 2.

Figure 3:
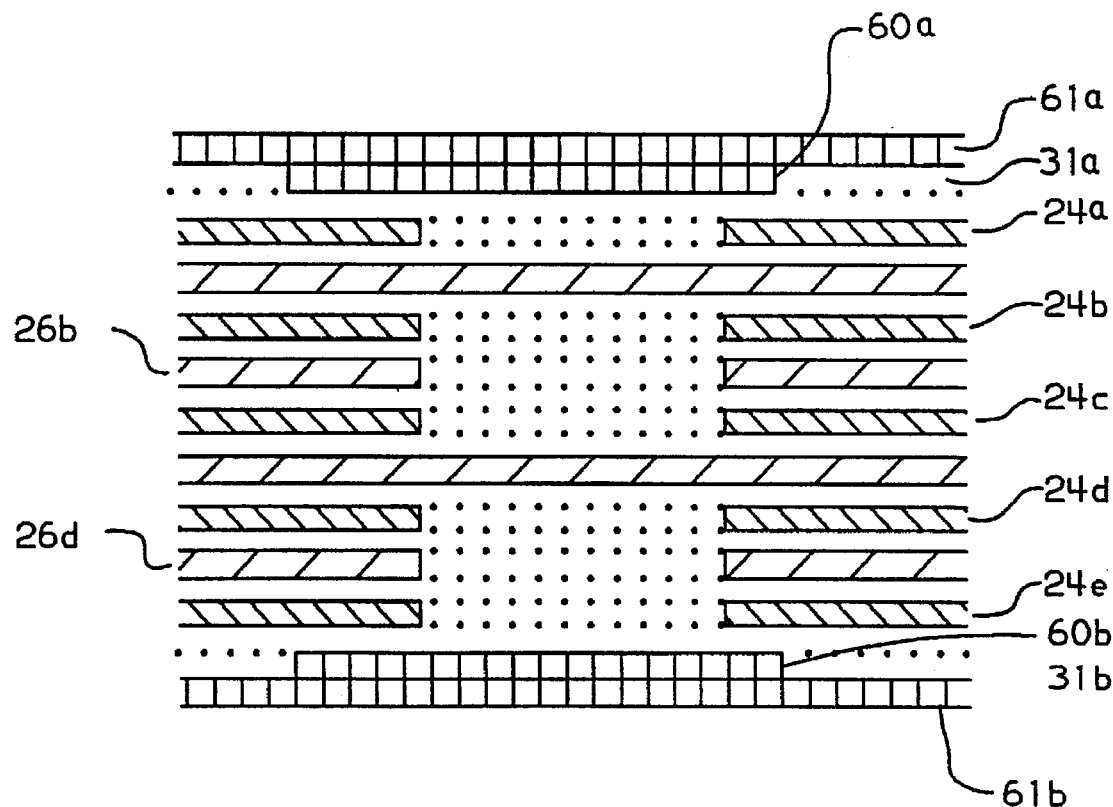
FIG. 3 is a cross-sectional view of the laminate and pattern foil of FIG. 2 after a subsequent lamination of the laminate to the pattern foil.
Figure 4:
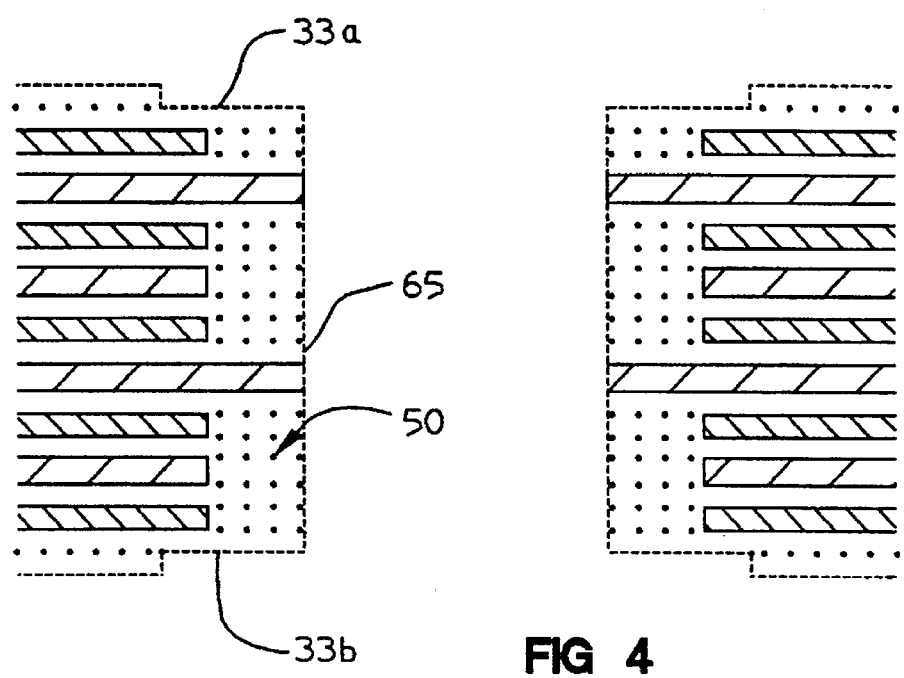
FIG. 4 is a cross-sectional view of the laminated product of FIG. 3 after a subsequent removal of the pattern foil and drilling or punching of a hole in the laminate.

Next, all of the foregoing layers are laminated together at temperature and pressure suitable for the materials chosen. FIG. 3 illustrates the result. Due to the pressure, the raised patterns 60a and 60b are embossed into surface layers 31a,b and by the end of this lamination step, the surface layers 31a,b are hard. Next, the entire pattern foil structure, i.e. the raised patterns 60a,b and backing sheet 61a,b of copper are etched away by exposure to appropriate etchants. This leaves recesses 33a,b for the surface lands 32a,b as illustrated in FIG. 4. Also, as illustrated in FIG. 4, a hole 65 for PTH 40 is drilled entirely through the laminate. A temporary layer may be added such as a photoresist before drilling to planarize the surface and provide mechanical support during the drilling. The hole is aligned through the center of recesses 33a,b to provide the clearance regions 50.

Figure 5:
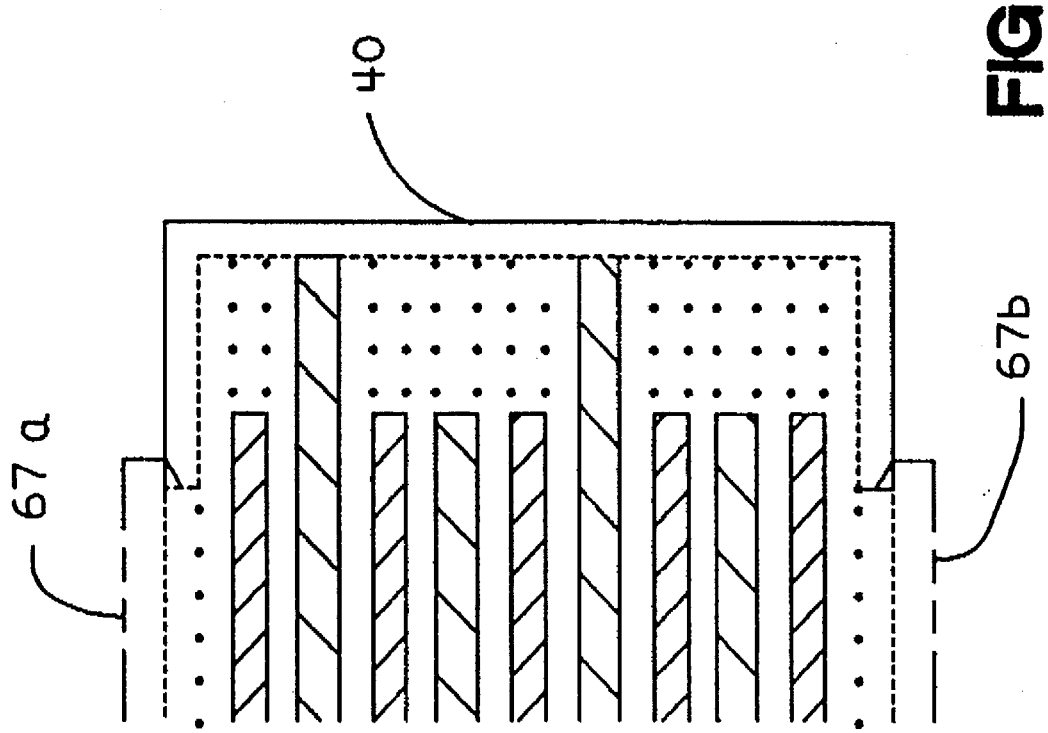
FIG. 5 is a cross-sectional view of the product of FIG. 4 after subsequent masking and copper plating steps.

Next, as illustrated in FIG. 5, the PTH 40 and surface lands 32a,b are formed by electrolessly seeding and strike plating the entire surface and putting photoresist 67a,b over the region surrounding the recesses 33a,b. Next copper and finish material are electrolytically plated into the recesses 33a,b and hole 65 to form the lands 32a,b and PTHs 40. Next, photoresist is stripped and the strike copper selectively etched from the surface. The finish metal may act as an etch resist for the etchant chosen. At this time, the printed circuit board 22 with the flush surface lands 32a,b is formed.

Figure 6:
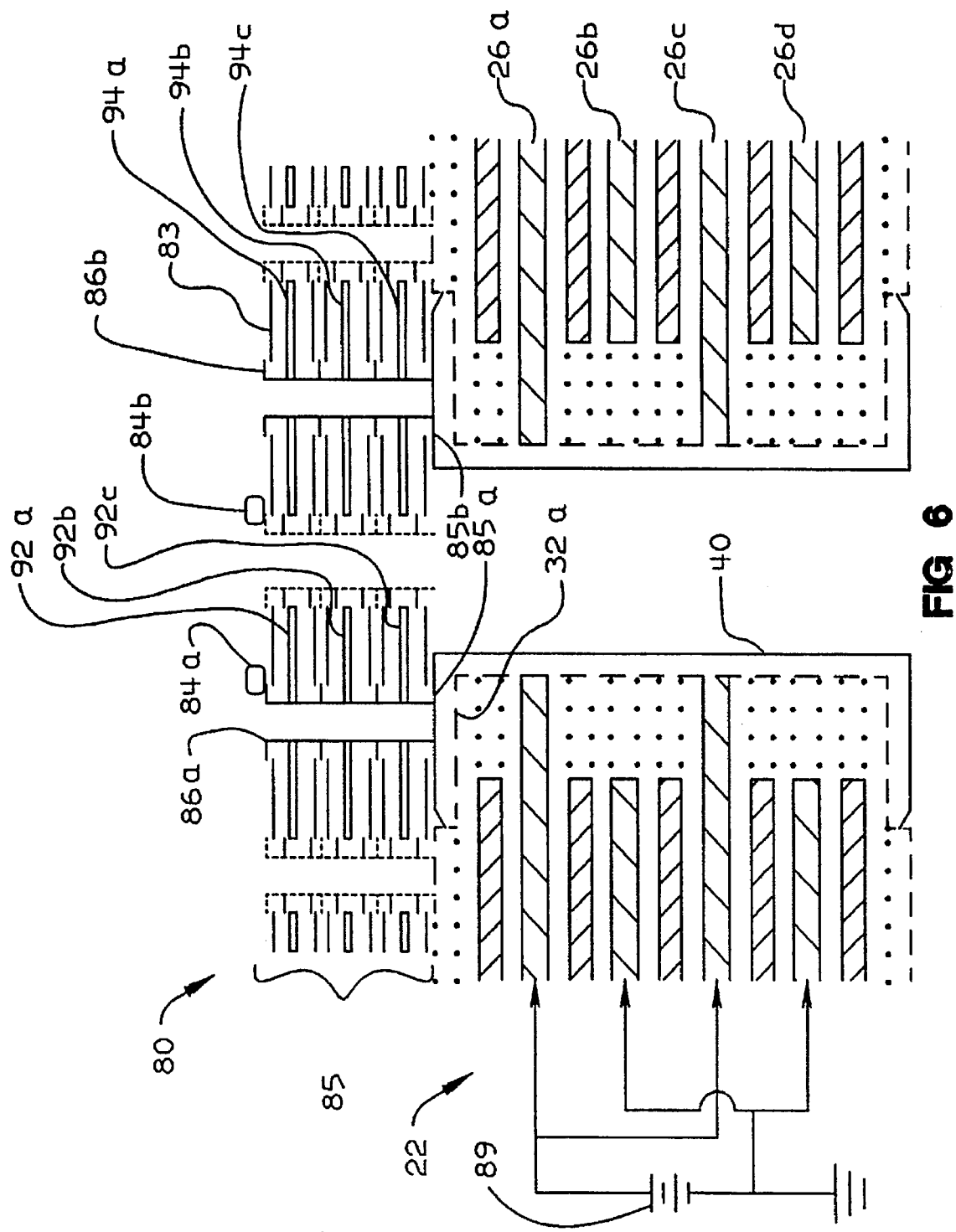
FIG. 6 is a cross-sectional view of the printed circuit board of FIGS. 1(a,b) joined to a main printed circuit board.

As one of many possible uses of printed circuit board 22, FIG. 6 illustrates printed circuit board 22 laminated to another, main printed circuit board 80 to distribute power thereto. In this example, main printed circuit board 80 is multilayer, comprises components 84a,b and printed conductors on one exposed surface 83, inner layers 85 including printed conductors 92a–c and 94a–c to provide other interconnections between the components 84a,b, and vias 86a,b with flush surface lands 88a,b which are connected to surface land 32a. Flush surface lands 88a,b are made as are surface lands 32a,b or according to U.S. Pat. No. 5,359,767.

A voltage source 89 is connected to conductive planes 26a,c and ground is connected to conductive planes 26b,d. Thus, conductive planes 26a,c, PTH 40 and surface land 32a bring power to main printed circuit board via surface lands 88a,b, PTHs 86a,b and printed conductors 92a–c and 94a–c. While not shown, another PTH, identical to PTH 40, and another surface land, identical to surface land 32a, in printed circuit board 22 is electrically connected to conductive planes 26b,d (instead of conductive planes 26a,c) and brings ground to main printed circuit board 80 via other surface lands, PTHs and printed conductors identical to surface lands 88a,b, PTH 86a,b and printed conductors 92a–c and 94a–c.

Based on the foregoing, a method for making a printed circuit board with flush surface lands has been disclosed. However, numerous modifications and substitutions can be made without deviating from the scope of the present invention. For example, there are alternate ways to form pattern foils 62a,b. Copper can be blanket plated on a stainless foil, then selectively etched to yield raised pattern 60a in the copper. Alternately, metal foil layers and thermoplastic dielectric layers are laminated as the external layers on a circuit board such that the metal foil is exposed. Then, pattern 60a,b is etched into external foil. Next, the etched pattern is relaminated and pressed into external dielectric layers of the PCB product. Finally, the pressed foil is removed by etching leaving embossed surface features 33a, b. There are additional applications for printed circuit board other than connection to main printed circuit board 80. Therefore, the present invention has been disclosed by way of illustration and not limitation, and reference should be made to the following claims to determine the scope of the present invention.

We claim:

1. A method for making a printed circuit board with a substantially flush surface land, said method comprising the steps of:

forming a multi-layer printed circuit board with a recess in a surface dielectric layer by forming a pattern on a backing sheet, said pattern being raised and having a shape corresponding to a shape of said recess, providing said surface layer in a flat deformable state without said recess and pressing said pattern into said surface layer while said surface layer exhibits said deformable state such that said pattern embosses said recess into said surface layer;

forming a hole into or through said printed circuit board, said hole communicating with said recess; and after said recess is formed, providing a conductive material in said recess to form a surface land and providing a conductive material on an inner surface of said hole to form a plated hole which is electrically connected to said surface land, said conductive material in said recess having a thickness substantially equal to a depth of said recess such that said surface land is substantially flush with an adjacent surface of said surface layer.

2. A method as set forth in claim 1 wherein said conductive material on said surface of said hole forms a plated through hole.

3. A method as set forth in claim 1 wherein said conductive material in said recess has a substantially uniform thickness and surrounds an opening of said hole.

4. A method as set forth in claim 2 wherein said recess is washer-shaped and said hole passes through a center of said recess.

5. A method as set forth in claim 1 wherein said hole forming step is performed by drilling.

6. A method as set forth in claim 1 further comprising the steps of:

hardening said embossed surface layer with said recess; and removing said backing sheet and pattern.

7. A method as set forth in claim 6 wherein said removing step is performed by etching away said backing sheet and pattern.

8. A method as set forth in claim 7 wherein said backing sheet and pattern are formed from metal.

9. A method as set forth in claim 8 wherein said pattern is plated on or etched into said backing sheet.

10. A method as set forth in claim 1 wherein said recess is 0.7–2.8 mils deep.

11. A method for making a printed circuit board with a substantially flush surface land, said method comprising the steps of:

forming a multi-layer printed circuit board with a recess in a surface dielectric layer and at least one conductor forming a layer or formed on a layer within said printed circuit board;

forming a hole into or through said primed circuit board, said hole adjoining said recess and said one conductor;

after said recess is formed, providing a conductive material in said recess and providing adjoining conductive material on a surface of said hole such that said at least one conductor is electrically connected to said conductive material in said recess, said conductive material in said recess having a thickness substantially equal to a depth of said recess such that said conductive material in said recess forms a surface land which is substantially flush with an adjacent surface of said surface layer;

electrically connecting a voltage source or ground to said one conductor; and surface mounting another printed circuit board to the first said printed circuit board, said other printed circuit board having another surface land which abuts against the first said surface land to receive the voltage or ground potential.

12. A method as set forth in claim 11 wherein the surface mounting step is performed by lamination.

13. A method as set forth in claim 11 wherein said other surface land is substantially flush with an adjacent surface area of said other printed circuit board.

14. A method as set forth in claim 11 wherein said conductive material in said recess is about 1.0 mils or greater in thickness.

15. A method as set forth in claim 11 wherein said hole forming step is performed by drilling.

16. A method for making a printed circuit board with a substantially flush surface land, said method comprising the steps of:

forming a multi-layer printed circuit board with a recess in a surface dielectric layer;

forming a hole into or through said printed circuit board, said hole communicating with said recess;

electrolessly seeding and strike plating said hole, said recess and said dielectric surface layer;

covering said dielectric surface layer with photoresist, said photoresist overhanging a perimiter of said recess but not substantially covering said recess;

electrolytically plating said hole and recess over electroless seed and strike plate which is exposed to form a plated hole which is electrically connected to said surface land, said conductive material in said recess having a thickness substantially equal to a depth of said recess in said surface dielectric layer; and removing said photoresist and electroless seed and strike plate underneath said photoresist such that said surface land is substantially flush with an adjacent surface of said surface dielectric layer.

17. A method for making a printed circuit board with a substantially flush surface land, said method comprising the steps of:

forming a multi-layer printed circuit board with a recess in a surface dielectric layer;

forming a hole into or through said primed circuit board, said hole communicating with said recess;

electrolessly seeding said hole, said recess and said dielectric surface layer;

covering said dielectric surface layer with photoresist, said photoresist overhanging a perimiter of said recess but not substantially covering said recess;

electrolytically plating said hole and recess over electroless seed which is exposed to form a plated hole which is electrically connected to said surface land, said conductive material in said recess having a thickness substantially equal to a depth of said recess in said surface dielectric layer; and removing said photoresist and electroless seed underneath said photoresist such that said surface land is substantially flush with an adjacent surface of said surface dielectric layer.

* * * * *